US008564289B2

(12) United States Patent
Tseng et al.

(10) Patent No.: US 8,564,289 B2
(45) Date of Patent: Oct. 22, 2013

(54) MR DIFFUSION WEIGHTED METHOD AND SYSTEM PROVIDING MICROSTRUCTURAL INFORMATION OF A BIOLOGICAL TARGET USING SINE CARDINAL (SINC) FUNCTION AND Q-SPACE SAMPLING

(75) Inventors: Isaac Wen-Yih Tseng, Taipei (TW); Fang-Cheng Yeh, Taipei (TW)

(73) Assignee: Isaac Wen-Yih Tseng, Taipei (TW)

( * ) Notice: Subject to any disclaimer, the term of this patent is extended or adjusted under 35 U.S.C. 154(b) by 864 days.

(21) Appl. No.: 12/694,429

(22) Filed: Jan. 27, 2010

(65) Prior Publication Data

US 2010/0253337 A1    Oct. 7, 2010

(30) Foreign Application Priority Data

Apr. 6, 2009 (TW) .............................. 98111372 A

(51) Int. Cl.
*G01R 33/48* (2006.01)

(52) U.S. Cl.
USPC .......................................... 324/309; 324/318

(58) Field of Classification Search
USPC ..................... 324/300–322; 600/407–435; 382/128–131
See application file for complete search history.

(56) References Cited

U.S. PATENT DOCUMENTS

| 5,539,310 | A  | * | 7/1996  | Basser et al. ............. 324/307 |
| 5,786,692 | A  | * | 7/1998  | Maier et al. ............. 324/307 |
| 6,528,997 | B2 | * | 3/2003  | Zhong et al. ............. 324/307 |
| 6,992,484 | B2 | * | 1/2006  | Frank ............. 324/307 |
| 7,034,531 | B1 | * | 4/2006  | Tuch et al. ............. 324/309 |
| 7,078,897 | B2 | * | 7/2006  | Yablonskiy et al. ............. 324/307 |
| 7,643,863 | B2 | * | 1/2010  | Basser et al. ............. 600/410 |
| 8,169,216 | B2 | * | 5/2012  | Yanasak ............. 324/307 |
| 2003/0160612 | A1 | * | 8/2003 | Yablonskiy et al. ............. 324/307 |
| 2005/0007100 | A1 | * | 1/2005 | Basser et al. ............. 324/200 |
| 2005/0068031 | A1 | * | 3/2005 | Frank ............. 324/309 |
| 2006/0244448 | A1 | * | 11/2006 | Ballon et al. ............. 324/318 |
| 2007/0156045 | A1 | * | 7/2007 | Mistretta et al. ............. 600/410 |
| 2009/0010517 | A1 | * | 1/2009 | Basser et al. ............. 382/131 |
| 2010/0253337 | A1 | * | 10/2010 | Tseng et al. ............. 324/309 |
| 2010/0329528 | A1 | * | 12/2010 | Hajnal et al. ............. 382/131 |
| 2011/0144478 | A1 | * | 6/2011 | Zabow et al. ............. 600/420 |
| 2011/0218253 | A1 | * | 9/2011 | Lange et al. ............. 514/789 |
| 2011/0282181 | A1 | * | 11/2011 | Wang et al. ............. 600/407 |
| 2012/0187946 | A1 | * | 7/2012 | Stamm et al. ............. 324/309 |
| 2012/0280686 | A1 | * | 11/2012 | White et al. ............. 324/309 |

* cited by examiner

*Primary Examiner* — Melissa Koval
*Assistant Examiner* — Tiffany Fetzner
(74) *Attorney, Agent, or Firm* — Merchant & Gould P.C.

(57) ABSTRACT

A method is adapted for providing microstructural information of a biological target from a plurality of diffusion weighted MR images corresponding to a specific area of the biological target. Each of the diffusion weighted MR images is obtained using a respective q-space sampling vector and is sampled at a plurality of sample points thereof to obtain a group of diffusion weighted MR image data. The diffusion weighted MR image data are processed to obtain a spin distribution function from which the microstructural information of the biological target can be obtained.

25 Claims, 6 Drawing Sheets

MR DIFFUSION WEIGHTED METHOD AND SYSTEM PROVIDING MICROSTRUCTURAL INFORMATION OF A BIOLOGICAL TARGET USING SINE CARDINAL (SINC) FUNCTION AND Q-SPACE SAMPLING

CROSS-REFERENCE TO RELATED APPLICATION

This application claims priority of Taiwanese Application No. 098111372, filed on Apr. 6, 2009.

BACKGROUND OF THE INVENTION

1. Field of the Invention

The present invention relates to a method and a system for providing microstructural information of a biological target, more particularly to a method and a system for providing microstructural information of a biological target obtained from a plurality of diffusion weighted magnetic resonance images corresponding to a specific area of the biological target.

2. Description of the Related Art

Magnetic resonance imaging (MRI) is a noninvasive imaging technique commonly used for visualizing internal structures in vivo. The MRI uses a magnetic field to polarize the spin of hydrogen atoms of water in the biological tissue, and also uses radio frequency pulse to induce its excitation so as to cause the hydrogen nuclei to produce echo detectable by a MRI scanner.

Since 70% of a human body is water, MRI is a suitable noninvasive method for detecting organs and tissues of the human body. One type of MRI techniques, named diffusion MRI, is able to detect the water diffusion pattern of a living tissue. Since diffusion directions of water molecules contained in the biological tissue are affected by the structure of the biological tissue, the diffusion directions of the water molecules can be used for determining microstructure of the biological tissue. There are two imaging methods related to diffusion MRI to model such diffusion pattern, i.e., diffusion spectrum imaging (DSI) and Q-ball imaging (QBI).

Regarding the DSI, a MRI device is used to obtain a plurality of diffusion weighted image signals in q-space from a biological target (such as a brain). The diffusion weighted image signals are processed based upon Fourier transform, normalization, and integration to obtain an orientation distribution function (ODF) capable of representing directions of the water molecules. The ODF provides information about directions of fibers in the biological target, and a plot of the ODF is shown in FIG. 1. A vector a in FIG. 1 is one of possible directions of the fibers in the biological target, and axes x and y define all of the possible directions of the fibers. A magnitude of the vector a is a function value of the ODF. In FIG. 1, the plot of the ODF extends along the axis y, and therefore, it can be determined that the fibers are arranged along the axis y. However, since the DSI method requires interpolation for obtaining the ODF, computation in the DSI method is relatively complicated and the information provided by the ODF is relatively inaccurate.

The QBI method uses Funk-Radon transformation of the diffusion weighted image signals associated with a particular spherical surface to obtain the ODF, and the ODF is then normalized. Although computation in the QBI method is relatively simpler than that of the DSI method, the QBI method cannot be applied to any kind of q-space sampling systems. Thus, application of the QBI is limited.

SUMMARY OF THE INVENTION

Therefore, an object of the present invention is to provide a method for providing microstructural information of a biological target that involves a simple processing procedure applicable to any kind of q-space sampling systems and that has relatively high accuracy.

According to an aspect of this invention, a method is adapted for providing microstructural information of a biological target. The microstructural information is obtained from a plurality of diffusion weighted magnetic resonance (MR) images corresponding to a specific area of the biological target. Each of the diffusion weighted MR images is obtained using a respective q-space sampling vector and is sampled at a plurality of sample points thereof to obtain a group of diffusion weighted MR image data. Each of the sample points corresponds to a voxel coordinate in laboratory space. The method comprises the steps of:

a) receiving the groups of diffusion weighted MR image data associated with the diffusion weighted MR images corresponding to the specific area of the biological target;

b) for each of the diffusion weighted MR images, determining a corresponding sine cardinal function of diffusion directions of water molecules contained in the biological target based upon the respective q-space sampling vector and a predetermined diffusion distance of the water molecules;

c) for each of the groups of diffusion weighted MR image data obtained from the diffusion weighted MR images, multiplying the corresponding sine cardinal function and one of the diffusion weighted MR image data therein that is associated with one of the sample points having a predetermined voxel coordinate in the laboratory space;

d) based upon a summation of products respectively obtained for the groups of diffusion weighted MR image data in step c), determining a spin distribution function associated with the predetermined voxel coordinate used in step c);

e) repeating steps c) and d) using another one of the diffusion weighted image MR data, that is associated with another one of the sample points in the laboratory space, for each of the groups of the diffusion weighted MR image data until all of the diffusion weighted MR image data in each of the groups have been considered; and f) providing the microstructural information of the biological target according to the diffusion directions and the spin distribution functions obtained after step e).

Another object of the present invention is to provide a system for providing microstructural information of a biological target that involves a simple processing procedure and that has relatively high accuracy.

According to another aspect of this invention, a system is adapted for providing microstructural information of a biological target. The microstructural information is obtained from a plurality of diffusion weighted MR images corresponding to a specific area of the biological target. Each of the diffusion weighted images is obtained using a respective q-space sampling vector. The system comprises a q-space sampling unit and an image processing unit. The q-space sampling unit is operable to sample each of the diffusion weighted MR images at a plurality of sample points thereof to obtain a group of diffusion weighted MR image data. Each of the sample points corresponds to a voxel coordinate in the laboratory space. The image processing unit is coupled to the q-space sampling unit, and is operable to process the diffusion weighted MR image data from the q-space sampling unit according to a data processing procedure to provide the microstructural information of the biological target.

According to yet another aspect of this invention, a system is adapted for providing microstructural information of a biological target. The microstructural information is obtained from a plurality of diffusion weighted MR images corresponding to a specific area of the biological target. Each of the diffusion weighted MR images is obtained using a respective q-space sampling vector and is sampled at a plurality of sample points thereof to obtain a group of diffusion weighted MR image data. Each of the sample points corresponds to a voxel coordinate in laboratory space. The system comprises a plurality of multiplier generating modules, a plurality of multiplication modules, an addition module, an analyzing module, and an output module.

Each of the multiplier generating modules is operable to generate a sine cardinal function of diffusion directions of water molecules contained in the biological target for a corresponding one of the diffusion weighted MR images corresponding to the specific area of the biological target based upon the respective q-space sampling vector and a predetermined diffusion distance of the water molecules. Each of the multiplication modules is coupled to a respective one of the multiplier generating modules, and is operable to multiply the sine cardinal function from the respective one of the multiplier generating modules and one of the diffusion weighted MR image data that is in a corresponding one of the groups of diffusion weighted MR image data obtained from the diffusion weighted MR images and that is associated with one of the sample points having a predetermined voxel coordinate in the laboratory space. The addition module is coupled to the multiplication modules, and is operable to determine a spin distribution function that is associated with the predetermined voxel coordinate used by the multiplication modules and that is based upon a summation of products respectively obtained by the multiplication modules for the groups of diffusion weighted MR image data. The analyzing module is coupled to the addition module, and is operable to provide the microstructural information of the biological target according to the diffusion directions and the spin distribution function determined by the addition module. The output module is coupled to the analyzing module for outputting the microstructural information provided by the analyzing module.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
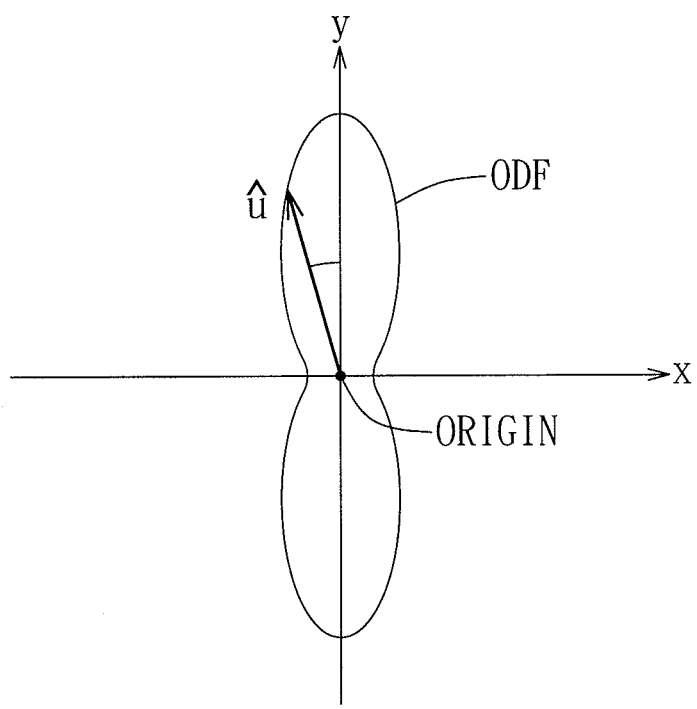
FIG. 1 is a schematic plot of an orientation distribution function obtained by diffusion spectrum imaging.
Figure 2:
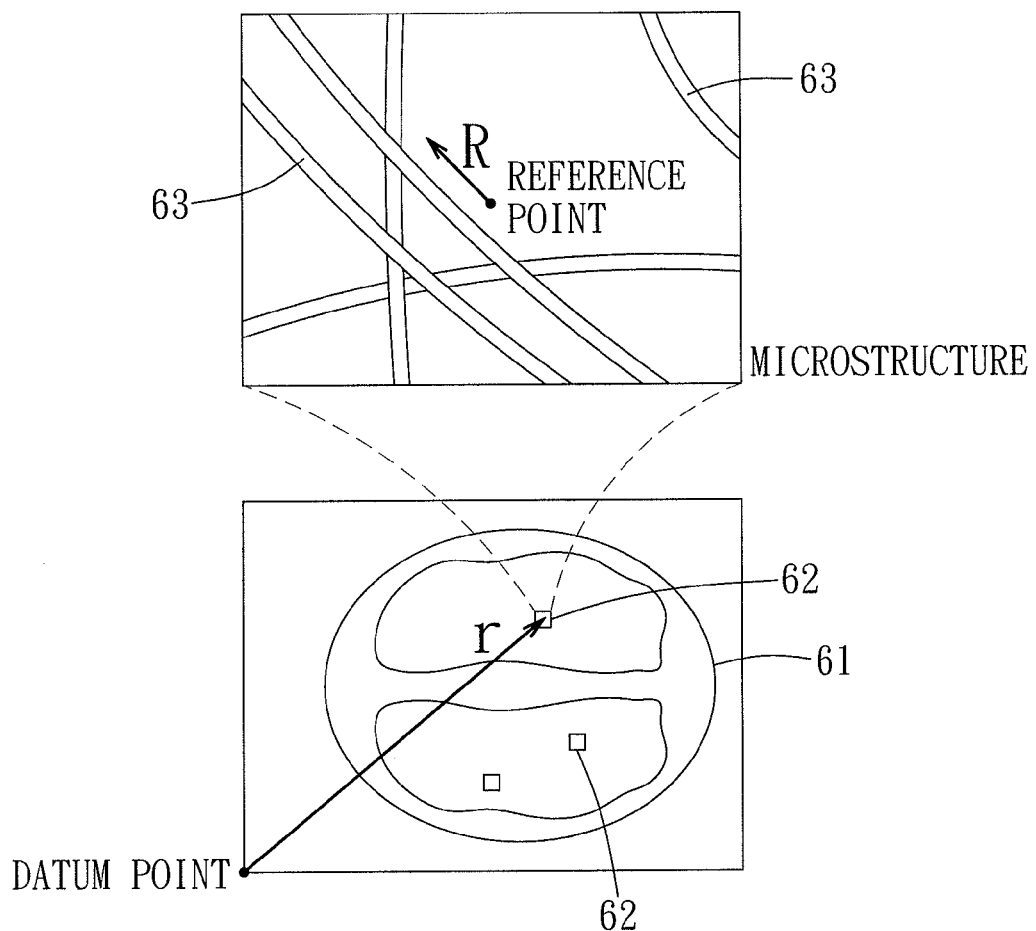
FIG. 2 is a schematic diagram of a biological target and a microstructure of the biological target.

Referring to FIG. 2, a biological target 61 can been seen as a plurality of tissue sections 62 each of which includes a plurality of fibers 63. It is well known that, in a microstructure of a corresponding one of the tissue sections 62 that is associated with a voxel coordinate r in laboratory space, a probability of average displacement of water molecules along a vector R in a diffusion time $\Delta$ can be expressed as an average propagator $p_\Delta(r,R)$, and an amount of the water molecules in the fibers 63 of the corresponding one of the tissue sections 62 can be expressed as a spin density $\rho(r)$. Considering the average propagator $p_\Delta(r,R)$ and the spin density $\rho(r)$ together, a spin density function is provided, i.e., $Q(r,R)=\rho(r)p_\Delta(r,R)$, for representing amount distribution of diffused water molecules in the fibers 63 of the corresponding one of the tissue sections 62.

In order to represent overall amount distribution of the diffused water molecules in the fibers 63 of the corresponding one of the tissue sections 62, a diffusion weighted magnetic resonance (MR) image data reveals the underlying average propagator of each observed voxel, and the diffusion weighted MR image data can be expressed as $$W(r,q) = \int Q(r,R)e^{j2\pi qR}dR \qquad (1)$$
$$= \int \rho(r)p_\Delta(r,R)e^{j2\pi qR}dR,$$

where q is a respective q-space sampling vector used in obtaining a diffusion weighted MR image corresponding to a specific area of the biological target 61. By applying Fourier Transform on the diffusion weighted MR image data $W(r,q)$ in Equation (1), the spin density function can be expressed as $$Q(r,R)=\int W(r,q)e^{-j2\pi qR}dq. \qquad (2)$$

Since the spin density function $Q(r,R)$ is positive real, the diffusion weighted MR image data $W(r,q)$ is symmetric in the q-space, i.e., $W(r,q)=W(r,-q)$. Therefore, Equation (2) can be rewritten as $$Q(r,R)=\int W(r,q)\cos(2\pi qR)dq. \qquad (3)$$

In order to determine whether there are fibers 63 arranged along a diffusion direction $\hat{u}$ in the microstructure, the spin density function, which is related to the water molecule diffusion along the diffusion direction $\hat{u}$ in a diffusion sampling distance L from a reference point, is expressed as $Q(r,L\hat{u})$. Considering the water molecule diffusion in the diffusion time $\Delta$, a spin distribution function (SDF) is provided to represent the amount distribution of the water molecules in a predetermined diffusion distance $L_\Delta$ along the diffusion direction $\hat{u}$ in the microstructure of the corresponding one of the tissue sections 62 that is associated with the voxel coordinate r. Accordingly, the SDF can be expressed as $$\psi_Q(r,\hat{u}) = \int_0^{L_\Delta} Q(r,L\hat{u})dL. \qquad (4)$$

Based upon Equations (3) and (4), the SDF can be rewritten as Equation (5) for revealing a relation to the diffusion weighted MR image data W(r,q).

$$\psi_Q(r, \hat{u}) = \int_0^{L_\Delta} \int W(r, q)\cos(2\pi Lq \cdot \hat{u}) dq\, dL \quad (5)$$
$$= L_\Delta \int W(r, q)\operatorname{sinc}(2\pi L_\Delta q \cdot \hat{u}) dq$$

Considering sampling density, the discrete form of Equation (5) is expressed as $$\psi_m(r, \hat{u}) = d_q^{-1} \sum_q W(r, q)\operatorname{sinc}(2\pi L_\Delta q \cdot \hat{u}). \quad (6)$$

From Equation (6), the SDF can be directly obtained according to the diffusion weighted MR image data W(r,q) for determining the microstructural information of the biological target 61. According to this embodiment, a method for providing microstructural information of a biological target 61 does not involve the Fourier transform and Funk-Radon transform used in conventional methods. Therefore, the method of this invention is relatively simple and accurate.

Moreover, it is noted that accuracy of the information provided by the SDF depends on an amount of the diffusion weighted MR images corresponding to the specific area of the biological target 61, i.e., an amount of the q-space sampling vectors q in Equation (6). However, a sine cardinal function will converge with an increasing absolute value of a variable of the sine cardinal function. Regarding Equation (6), when the respective q-space sampling vector q increases, an inner product of the respective q-space sampling vector q and a diffusion vector composed by the diffusion direction û and the predetermined diffusion distance $L_\Delta$ decreases, and a value of the sine cardinal function also decreases. Therefore, for Equation (6), only values of the corresponding sine cardinal function that are associated with those diffusion directions û satisfying a predetermined condition are considered. The predetermined condition is an absolute value of the inner product of the respective q-space sampling vector q and the diffusion vector must be smaller than a threshold value.

Figure 3:
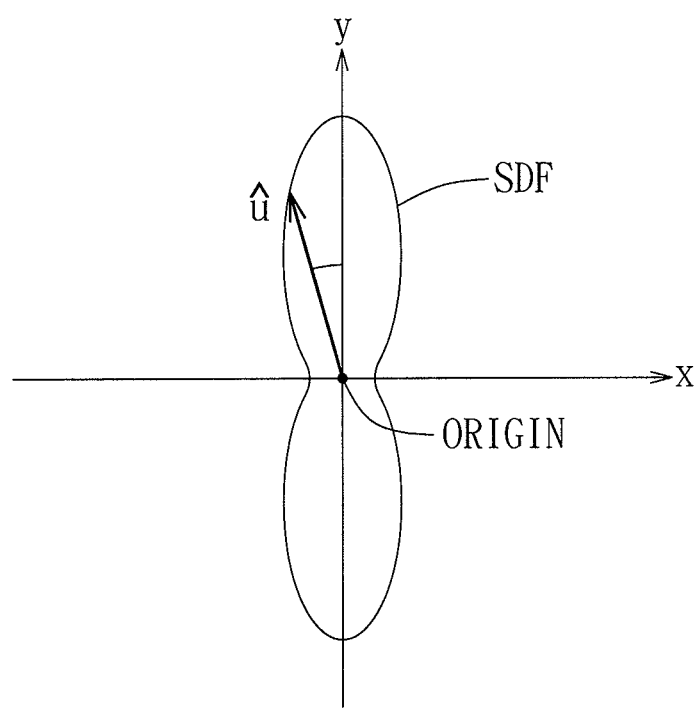
FIG. 3 is a schematic plot of a spin distribution function obtained by a method according to this invention for providing information about directions and an amount of fibers in the biological target.
Figure 4:
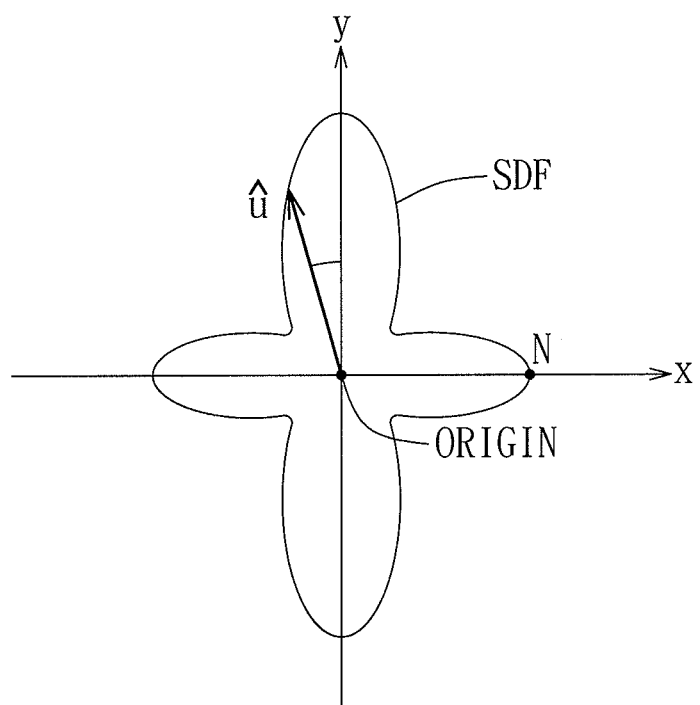
FIG. 4 is a schematic plot of the spin distribution function for illustrating the possible directions of cross fibers in the biological target.

FIG. 3 is a schematic plot of the SDF of Equation (6). An origin of the plot in FIG. 3 is associated with a reference point in FIG. 2, axes x and y define all of the possible directions of the fibers 63 in the biological target 61, and a magnitude along the diffusion direction û is a function value of the SDF. In FIG. 3, the plot of the SDF extends along the axis y, and therefore, it can be determined that the fibers 63 are arranged along the axis y. In addition, it is possible that the fibers 63 cross one another, and the plot of the SDF corresponding to such condition is shown in FIG. 4. Since the plot in FIG. 4 extends along the axes x and y, it can be determined that the fibers 63 are arranged along the axes x and y. In practice, the fibers 63 in the biological target 61 may be arranged along other directions, and the method for determining arranged directions of the fibers 63 is not limited to this embodiment.

Besides determination of the arranged directions of the fibers 63, the information provided by the SDF also relates to an amount of fibers 63 in the biological target 61. For example, referring to FIG. 4, when a value of the SDF on the axis x is N, there are N units of fibers arranged along the axis x. Although the value N is not an actual amount of the fibers 63, it can be used to determine a proportion of the actual amount of the fibers 63. Compared with an orientation distribution function that is obtained using a conventional method and that is only capable of presenting a distribution probability of the fibers 63, the information provided by the SDF is relatively useful.

Figure 5:
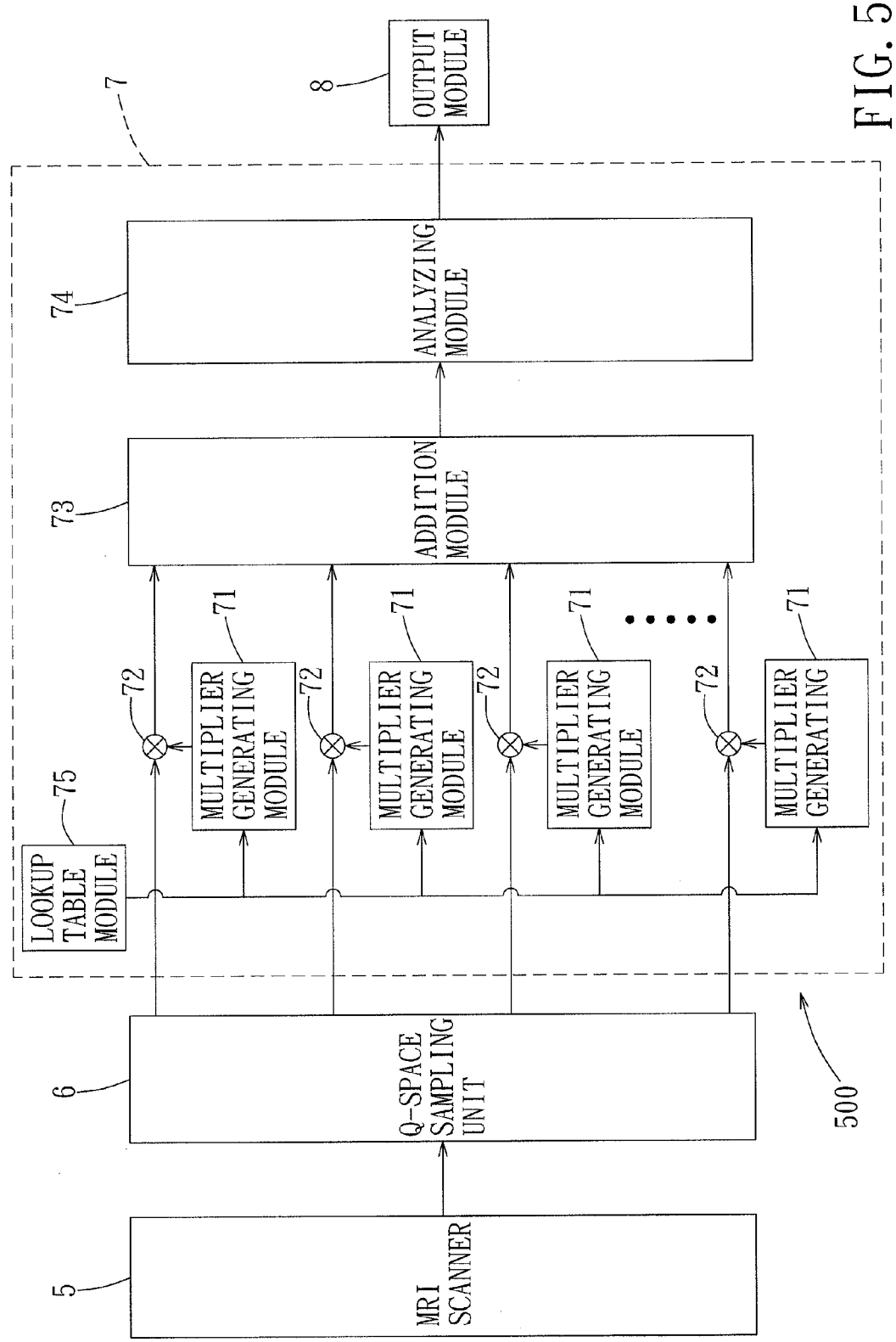
FIG. 5 is a block diagram of a preferred embodiment of a system for providing microstructural information of a biological target according to this invention.

Referring to FIG. 5, the preferred embodiment of a system 500 of the present invention for providing microstructural information of a biological target includes a magnetic resonance imaging (MRI) scanner 5, a q-space sampling unit 6 coupled to the MRI scanner 5, an image processing unit 7 coupled to the q-space sampling unit 6, and an output module 8 coupled to the image processing unit 7. The image processing unit 7 includes a plurality of multiplier generating modules 71, a plurality of multiplication modules 72, an addition module 73, and an analyzing module 74. Each of the multiplication modules 72 is coupled to a respective one of the multiplier generating modules 71, the addition module 73 is coupled to the multiplication modules 72, and the analyzing module 74 is coupled to the addition module 73.

Figure 6:
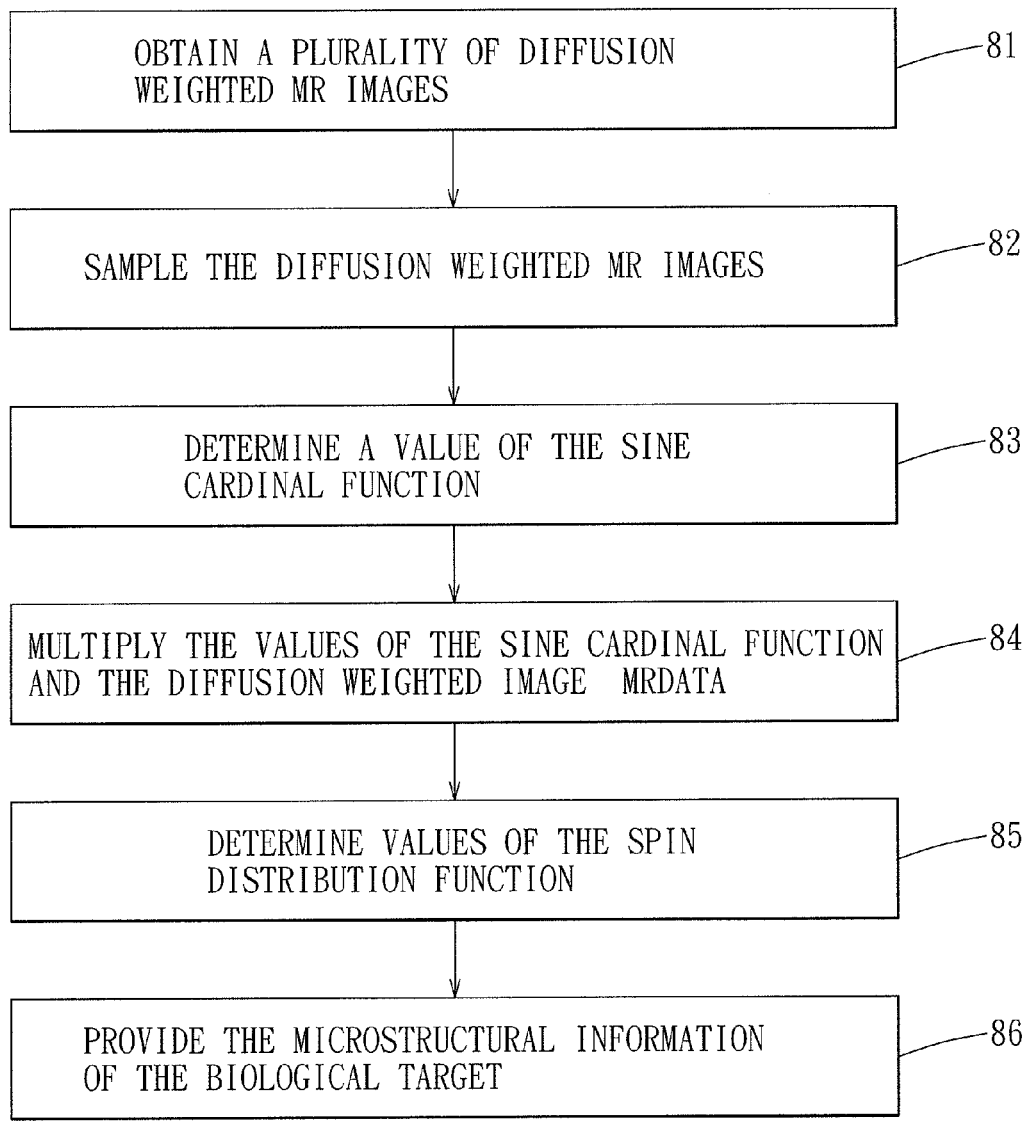
FIG. 6 is a flow chart of a preferred embodiment of a method for providing microstructural information of a biological target according to this invention.

Further referring to FIG. 6, a method implemented by the system 500 for providing microstructural information of a biological target includes the following steps.

In step 81, the MRI scanner 5 is operable to obtain a plurality of diffusion weighted MR images corresponding to the specific area of the biological target 61. In this embodiment, the MRI scanner 5 is configured to obtain the diffusion weighted MR images of at least one slice of the biological target 61. Each of the diffusion weighted MR images of the same slice of the biological target 61 is obtained using a respective q-space sampling vector q.

In step 82, the q-space sampling unit 6 is operable to sample each of the diffusion weighted MR images at a plurality of sample points thereof to obtain a group of the diffusion weighted MR image data W(r,q). Each of the sample points corresponds to a voxel coordinate r in the laboratory space. It should be noted that since the diffusion weighted MR image data W(r,q) relate to the spin density ρ(r), the diffusion weighted MR image data W(r,q) are capable of indicating the amount distribution of the diffused water molecules contained in the biological target 61.

In step 83, each of the multiplier generating modules 71 is operable to generate a sine cardinal function, $\operatorname{sinc}(2\pi L_\Delta q \cdot \hat{u})$, for a corresponding one of the diffusion weighted MR images of the same slice of the biological target 61. Further, each of the multiplier generating modules 71 is operable to determine values of the sine cardinal function associated with the diffusion directions û. In practice, the values of the sine cardinal function can be pre-stored in a lookup table module 75 as shown in FIG. 5 for the multiplier generating modules 71. Moreover, the predetermined diffusion distance $L_\Delta$ between $\sqrt{6D\Delta}$ and $2\sqrt{6D\Delta}$ is preferable for sampling, wherein D is a diffusion coefficient. An optimum value of the predetermined diffusion distance $L_\Delta$ still needs to be adjusted according to actual conditions.

In step 84, each of the multiplication modules 72 is operable to multiply each of the values of the sine cardinal function from the respective one of the multiplier generating modules 71, one of the diffusion weighted MR image data W(r,q), and the predetermined diffusion distance $L_\Delta$. This one of the diffusion weighted MR image data W(r,q) used herein is in a corresponding one of the groups of diffusion weighted MR image data W(r,q) obtained from the diffusion weighted MR images of the same slice of the biological target 61, and is associated with one of the sample points having a predetermined voxel coordinate r in the laboratory space.

In step 85, for each of the diffusion directions û, the addition module 73 is operable to determine a value of the SDF of Equation (6) based upon a summation of products that are respectively obtained by the multiplication modules 72 and that are associated with a respective one of the diffusion directions û. The SDF is associated with the predetermined voxel coordinate in the laboratory space used by the multiplication modules 72. Moreover, as described above, in the summation of the products upon which the value of the SDF is determined, only the values of the corresponding sine cardinal function that are associated with those diffusion directions satisfying the predetermined condition are considered.

Further, for each of the groups of the diffusion weighted MR image data W(r,q), steps 84 and 85 are repeated using another one of the diffusion weighted MR image data W(r,q) that is associated with having a different voxel coordinate r in the laboratory space. When all of the diffusion weighted MR image data W(r,q) in each of the groups have been considered, the flow goes to step 86.

In step 86, the analyzing module 74 is operable to provide the microstructural information of the biological target 61 according to the diffusion directions and the values of the SDF determined by the addition module 73. Then, the output module 8 is adapted for outputting the microstructural information provided by the analyzing module 74 in a form of a plot of the SDF or a simulated image that shows the fibers of the biological target 61.

In practice, the MRI scanner 5 is operated to obtain the diffusion weighted MR images of more than one slice of the biological target 61 in step 81. Steps 82 to 86 are repeated using the groups of diffusion weighted MR image data W(r,q) corresponding to the diffusion weighted MR images of another one of the slices of the biological target 61, such that the microstructural information of the biological target 61 provided in step 86 can be composed as three-dimensional microstructural information.

It should be noted that, in step 84, each of the multiplication modules 72 can be operated to obtain the products without the predetermined diffusion distance $L_A$. Alternatively, the addition module 73 can be operated to multiply the predetermined diffusion distance $L_A$ and the summation of the products in step 86, or each of the multiplier generating modules 71 can be operated to multiply the predetermined diffusion distance $L_A$ and the values of the sine cardinal function in step 83.

In other embodiments, the image processing unit 7 can be configured to receive the diffusion weighted MR image data W(r,q) directly from a memory device, such as a database (not shown). Therefore, steps 81 and 82 of the method described above can be omitted, and the MRI scanner 5 and the q-space sampling unit 6 of the system 500 can be also omitted. Additionally, the SDF obtained in step 85 can be normalized to obtain the orientation distribution function for providing the microstructural information of the biological target 61.

In summary, the system 500 is configured to obtain the SDF directly from the diffusion weighted MR image data W(r,q), and computation of the SDF is relatively simple. Moreover, the microstructural information provided by the SDF is relatively accurate. Based on in vivo experiments, for Q-ball imaging, simulation results show that an average major fiber deviation is 3.94°±3.46° when the predetermined diffusion distance $L_A$ is 35 µm, and a percentage of success in resolving minor fiber is 11.08% when the predetermined diffusion distance $L_A$, is 45 µm. Therefore, the objects of the present invention can be certainly achieved.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A method of providing microstructural information of a biological target, the microstructural information being obtained from a plurality of diffusion weighted magnetic resonance (MR) images corresponding to a specific area of the biological target, each of the diffusion weighted MR images being obtained with a magnetic resonance imaging system using a respective q-space sampling vector and being sampled at a plurality of sample points thereof in order to obtain a group of diffusion weighted MR image data points, with each of the sample points corresponding to a voxel coordinate in laboratory space, said method comprising the steps of:
   a) receiving the groups of diffusion weighted MR image data associated with the diffusion weighted MR images corresponding to the specific area of the biological target;
   b) for each of the diffusion weighted MR images, determining a corresponding SINe Cardinal (SINC) function of diffusion directions of water molecules contained in the biological target based upon the respective q-space sampling vector and a predetermined diffusion distance of the water molecules;
   c) for each of the groups of diffusion weighted MR image data obtained from the diffusion weighted MR images, multiplying the corresponding SINe Cardinal (SINC) function and one of the diffusion weighted MR image data points therein that is associated with one of the sample points having a predetermined voxel coordinate in the laboratory space;
   d) based upon a summation of products respectively obtained for the groups of diffusion weighted MR image data in step c), determining a spin distribution function (SDF) associated with the predetermined voxel coordinate used in step c);
   e) repeating steps c) and d) using another one of the diffusion weighted MR image data points, that is associated with another one of the sample points in the laboratory space, for each of the groups of the diffusion weighted MR image data, until all of the diffusion weighted MR image data in each of the groups have been considered; and
   f) providing the microstructural information of the biological target according to the diffusion directions and the spin distribution functions obtained after step e) to an output module.

2. The method as claimed in claim 1, wherein the microstructural information is obtained from the diffusion weighted MR images corresponding to a specific area in at least one slice of the biological target, and wherein the diffusion weighted MR image data received in step a) also corresponds to the diffusion weighted MR images of a specific area that is also within the same slice of the biological target.

3. The method as claimed in claim 2, wherein the microstructural information is obtained from the diffusion weighted MR images of more than one slice of the biological target, and wherein steps a) to f) are repeated using the groups of diffusion weighted MR image data, as well as the respective diffusion weighted MR image data points, within the groups of diffusion weighted MR image data, corresponding to the diffusion weighted MR images of another one of the slices of the biological target, such that the microstructural information of the biological target provided in step f) provides three-dimensional microstructural information.

4. The method as claimed in claim 1, wherein each group of the diffusion weighted MR image data received in step a) relates to a spin density, having a spin distribution function (SDF) and includes microstructural information with respect to an amount of the water molecules.

5. The method as claimed in claim 1, wherein the microstructural information provided in step f) relates to directions of fibers in the biological target.

6. The method as claimed in claim 1, wherein the microstructural information provided in step f) relates to an amount of fibers in the biological target.

7. The method as claimed in claim 1, wherein, in the summation of the products upon which the spin distribution function (SDF) is determined, only values of the corresponding SINe Cardinal (SINC) function that are associated with those diffusion directions satisfying a predetermined condition are considered, the predetermined condition being an absolute value of an inner product of the respective q-space sampling vector and a diffusion vector composed by the diffusion direction and the predetermined diffusion distance that must be smaller than a given threshold value.

8. The method as claimed in claim 1, wherein the corresponding sine cardinal function determined in step b) is based upon:

$$\sin c(2\pi L_\Delta q^* \hat{u}),$$

where $L_\Delta$ is the predetermined diffusion distance of the water molecules,
q is the respective q-space sampling vector, and
$\hat{u}$ is one of the diffusion directions of the water molecules.

9. The method as claimed in claim 8, wherein the spin distribution function is determined based upon:

$$\Psi_Q(r,\hat{u}) = L_\Delta \int W(r,q) \sin c(2\pi L_\Delta q^* \hat{u}) dq,$$

where $\Psi_Q$ is the spin distribution function,
W(r,q) are values of the diffusion weighted MR image data points, and
r is the voxel coordinate in the laboratory space.

10. The method as claimed in claim 1, wherein the information provided in step f) is in a form of, one of: a plot of the spin distribution function and a simulated image that shows fibers of the biological target.

11. A system compatible with magnetic resonance (MR), configured for providing microstructural information of a biological target, the microstructural information being obtained from a plurality of diffusion weighted magnetic resonance (MR) images corresponding to a specific area of the biological target, each of the diffusion weighted MR images being obtained with a magnetic resonance imaging system using a respective q-space sampling vector, said system comprising:

a q-space sampling unit operable to sample each of the diffusion weighted MR images at a plurality of sample points thereof in order to obtain a group of diffusion weighted MR image data points, with each of the sample points corresponding to a voxel coordinate in laboratory space; and an image processing unit coupled to said q-space sampling unit, and operable to process the diffusion weighted MR image data points from said q-space sampling unit according to a data processing procedure that includes the following steps:

(i) for each of the diffusion weighted MR images, determining a corresponding SINe Cardinal (SINC) function of diffusion directions of water molecules contained in the biological target based upon the respective q-space sampling vector and a predetermined diffusion distance of the water molecules;

(ii) for each of the groups of diffusion weighted MR image data obtained from the diffusion weighted MR images, multiplying the corresponding SINe Cardinal (SINC) function and one of the diffusion weighted MR image data points therein that is associated with one of the sample points having a predetermined voxel coordinate in the laboratory space;

(iii) based upon a summation of products respectively obtained for the groups of diffusion weighted MR image data in step ii), determining a spin distribution function (SDF) associated with the predetermined voxel coordinate used in step ii);

(iv) repeating steps ii) and iii) using another one of the diffusion weighted MR image data points, that is associated with another one of the sample points in the laboratory space, for each of the groups of diffusion weighted MR image data until all of the diffusion weighted MR image data in each of the groups have been considered; and (v) providing the microstructural information of the biological target according to the diffusion directions and the spin distribution functions obtained after step iv) to an output module.

12. The system as claimed in claim 11, wherein the microstructural information being obtained from the diffusion weighted MR images corresponds to at least one slice of a specific area of the biological target, and wherein said q-space sampling unit is operable to sample each of the diffusion weighted MR images of the same slice that is within a specific area of the biological target.

13. The system as claimed in claim 12, wherein the microstructural information being obtained is from the diffusion weighted MR images of more than one slice of the biological target, and wherein said processing unit performs the data processing procedure using the groups of diffusion weighted image data corresponding to the diffusion weighted images of another one of the slices of the biological target, such that the microstructural information of the biological target provided thereby is three-dimensional microstructural information.

14. The system as claimed in claim 11, wherein each group of the diffusion weighted MR image data sampled by said q-space sampling unit relates to a spin density, having a spin distribution function (SDF) and includes microstructural information with respect to an amount of the water molecules.

15. The system as claimed in claim 11, wherein the microstructural information provided by said image processing unit relates to directions of fibers in the biological target.

16. The system as claimed in claim 11, wherein the microstructural information provided by said image processing unit relates to an amount of fibers in the biological target.

17. The system as claimed in claim 11, wherein, in the summation of the products upon which the spin distribution function (SDF) is determined, only values of the corresponding SINe Cardinal (SINC) function that are associated with those diffusion directions satisfying a predetermined condition are considered, by said image processing unit, the predetermined condition being an absolute value of an inner product of the respective q-space sampling vector and a diffusion vector composed by the diffusion direction and the predetermined diffusion distance that must be smaller than a given threshold value.

18. The system as claimed in claim 11, wherein the corresponding sine cardinal function determined by said image processing unit is based upon:

$$\sin c(2\pi L_\Delta q^* \hat{u}),$$

where $L_\Delta$ is the predetermined diffusion distance of the water molecules,
q is the respective q-space sampling vector, and
$\hat{u}$ is one of the diffusion directions of the water molecules.

19. The system as claimed in claim 18, wherein the spin distribution function is determined by said image processing unit based upon:

$$\Psi_Q(r;\hat{u}) = L_\Delta \int W(r,q) \sin c(2\pi L_\Delta q^* \hat{u}) dq,$$

where $\Psi_Q$ is the spin distribution function, W(r,q) are values of the diffusion weighted MR image data points, and r is the voxel coordinate in the laboratory space.

20. The system as claimed in claim 11, wherein the information provided by said image processing unit is in a form of, one of: a plot of the spin distribution function and a simulated image that shows fibers of the biological target.

21. A system compatible with magnetic resonance (MR), configured for providing microstructural information of a biological target, the microstructural information being obtained from a plurality of diffusion weighted magnetic resonance (MR) images corresponding to a specific area of the biological target, each of the diffusion weighted MR images being obtained with a magnetic resonance imaging system using a respective q-space sampling vector and being sampled at a plurality of sample points thereof in order to obtain a group of diffusion weighted MR image data points, with each of the sample points corresponding to a voxel coordinate in the laboratory space, said system comprising:
 a plurality of multiplier generating modules, each of which is operable in order to generate a SINe Cardinal (SINC) function of diffusion directions of water molecules contained in the biological target for a corresponding one of the diffusion weighted MR images corresponding to the specific area of the biological target based upon the respective q-space sampling vector and a predetermined diffusion distance of the water molecules;
 a plurality of multiplication modules, each of which is coupled to a respective one of said multiplier generating modules and is operable to multiply the SINe Cardinal (SINC) function from the respective one of said multiplier generating modules and one of the diffusion weighted MR image data points that is in a corresponding one of the groups of diffusion weighted MR image data obtained from the diffusion weighted MR images and that is associated with a corresponding one of the sample points having a predetermined voxel coordinate in the laboratory space;
 an addition module coupled to said multiplication modules and operable in order to determine a spin distribution function (SDF) that is associated with the predetermined voxel coordinate used by said multiplication modules and that is based upon a summation of products respectively obtained by said multiplication modules for the groups of diffusion weighted MR image data;
 an analyzing module coupled to said addition module and operable to provide the microstructural information of the biological target according to the diffusion directions and the spin distribution function (SDF) determined by said addition module; and
 an output module coupled to said analyzing module configured for outputting the microstructural information provided by said analyzing module.

22. The system as claimed in claim 21, further comprising a database coupled to said multiplication modules, from which said multiplication modules receive the diffusion weighted MR image data.

23. The system as claimed in claim 21, wherein said analyzing module is configured to analyze:
 the diffusion directions and
 the spin distribution function (SDF) in order to provide microstructural information relating to directions of fibers in the biological target.

24. The system as claimed in claim 21, wherein said analyzing module is configured to analyze:
 the diffusion directions and
 the spin distribution function (SDF) in order to provide microstructural information relating to an amount of fibers in the biological target.

25. The system as claimed in claim 21, wherein said output module is configured to output the microstructural information provided by said analyzing module in a form of, one of; a plot of the spin distribution function and a simulated image that shows fibers of the biological target.

* * * * *